United States Patent [19]

van Driest

[11] Patent Number: 4,528,519

[45] Date of Patent: Jul. 9, 1985

[54] AUTOMATIC GAIN CONTROL

[75] Inventor: Hans van Driest, Bilthoven, Netherlands

[73] Assignee: NCR Corporation, Dayton, Ohio

[21] Appl. No.: 509,280

[22] Filed: Jun. 30, 1983

[30] Foreign Application Priority Data

Jan. 12, 1983 [GB] United Kingdom ............... 8300696

[51] Int. Cl.$^3$ .............................................. H03G 3/20
[52] U.S. Cl. .................................... 330/279; 330/280
[58] Field of Search ............... 330/278, 279, 280, 281, 330/136

[56] References Cited

U.S. PATENT DOCUMENTS 3,983,381 9/1976 Jones, Jr. ............................ 235/154
4,115,741 9/1978 Skutta ................................ 330/284
4,360,787 11/1982 Gaipin ................................ 330/279

FOREIGN PATENT DOCUMENTS 961131 6/1964 United Kingdom .
1193324 5/1970 United Kingdom .
1436627 5/1976 United Kingdom .
2026269 1/1980 United Kingdom .
2073977 10/1981 United Kingdom .

OTHER PUBLICATIONS

"A Review of Automatic Gain Control Theory" by D. V. Mercy, published by Institution of Electronic and Radio Engineers, 99 Gower St., London WC1, England, in the Radio and Electronic Engineer, vol. 51, No. 11/12, Dec. 1981, pp. 579-590.

Primary Examiner—James B. Mullins
Assistant Examiner—G. Wan
Attorney, Agent, or Firm—Albert L. Sessler, Jr.; George Jameson

[57] ABSTRACT

An automatic gain control circuit suitable for use in a modem receiver for receiving a modulated carrier representing data, includes a variable gain amplifier adapted to receive an input signal and coupled to an output amplifier providing the gain controlled output and also coupled to a level detector which provides a high level output signal whenever the input thereto exceeds a reference level, such output signal causing an attack operation wherein a control current generator provides an exponentially decreasing control current for an operational transconductance amplifier included in the variable gain amplifier. When the level detector output is high for more than a predetermined time a noise hit protection circuit is effective to inhibit the attack operation for a further predetermined period of time, thereby alleviating the adverse effect of a noise pulse.

10 Claims, 15 Drawing Figures

AUTOMATIC GAIN CONTROL

BACKGROUND OF THE INVENTION

This invention relates to automatic gain control circuits of the kind including variable gain amplifying means adapted to amplify an input signal, control signal generator means adapted to generate a control signal for controlling the gain of said variable gain amplifying means, and level detection means coupled to an output of said variable gain amplifying means and to an input of said control signal generating means.

A particular application of automatic gain control circuits of the kind specified is in a data modem receiver utilized in a digital data transmission system wherein the data is transmitted in the form of a modulated carrier wave as an analog signal over a transmission medium such as a telephone line. As is well known the imperfect characteristics of the analog transmission medium cause the signal received at the remote receiver to differ from that transmitted, since the signal may be corrupted by various impairments during transmission. In some types of modulation, such as quadrature amplitude modulation (QAM), the amplitude of the received signal is of particular significance. One type of impairment which affects the amplitude of the signal is known as a gain hit and is a sudden change in signal level. Such an impairment may be compensated for by providing an automatic gain control circuit at the input to the modem receiver. Such automatic gain control circuit should have a wide dynamic range in order to provide effective compensation where the unimpaired received signal may vary over a large range, such as about 40 decibels (dB), depending on the losses experienced in the transmission channel. The automatic gain control circuit should provide a reliable signal level prior to any analog-to-digital conversion which may take place in a modem wherein the received signal is processed digitally.

An automatic gain control circuit of the kind specified is known from the article "A review of automatic gain control theory" by D. V. Mercy, published by Institution of Electronic and Radio Engineers, 99 Gower Street, London WC1, England, in The Radio and Electronic Engineer, vol. 51, No. 11/12, December 1981, pages 579–590. See especially FIG. 2 on page 580.

The known automatic gain control circuit has the disadvantage that the incidence of impulse noise in the transmission may adversely affect the performance of the automatic gain control circuit. Thus, the circuit gain may change considerably in response to a noise pulse in view of such a noise pulse typically having a large amplitude. Since the automatic gain control circuit cannot respond to signal level changes instantaneously, the output signal of the gain control circuit in the period shortly after termination of a noise pulse is likely to be at an unsuitable level for further processing whereby errors may arise.

SUMMARY OF THE INVENTION

It is an object of the present invention to provide an automatic gain control circuit of the kind specified wherein the aforementioned disadvantage is alleviated.

Therefore, according to the present invention, there is provided an automatic gain control circuit of the kind specified wherein the level detection means is adapted to provide a first or a second logic signal to the control signal generator means according to whether the output signal of the variable gain amplifying means is greater or less than a predetermined level, the first and second logic signals causing the control signal generator means to vary the control signal in respective first and second directions so as to respectively reduce and increase the gain of said variable gain amplifying means, and protection means coupled to said level detection means and adapted whenever the first logic signal is provided for longer than a first predetermined time period to cause said control signal generator means to prevent the control signal from varying in the first direction for a second predetermined time period, thereby inhibiting any reduction in gain of said variable gain amplifying means during the second predetermined time period.

It will be appreciated that in an automatic gain control circuit according to the invention this protection means permits only a limited response to a gain change. Thus, by selecting the second predetermined time period to be greater than the duration of a typical noise pulse, the circuit response to such noise pulse is limited despite such noise pulse possibly being of a high amplitude level.

BRIEF DESCRIPTION OF THE DRAWINGS

One embodiment of the invention will now be described by way of example with reference to the accompanying drawings, in which.

DESCRIPTION OF THE PREFERRED EMBODIMENT

Figure 1:
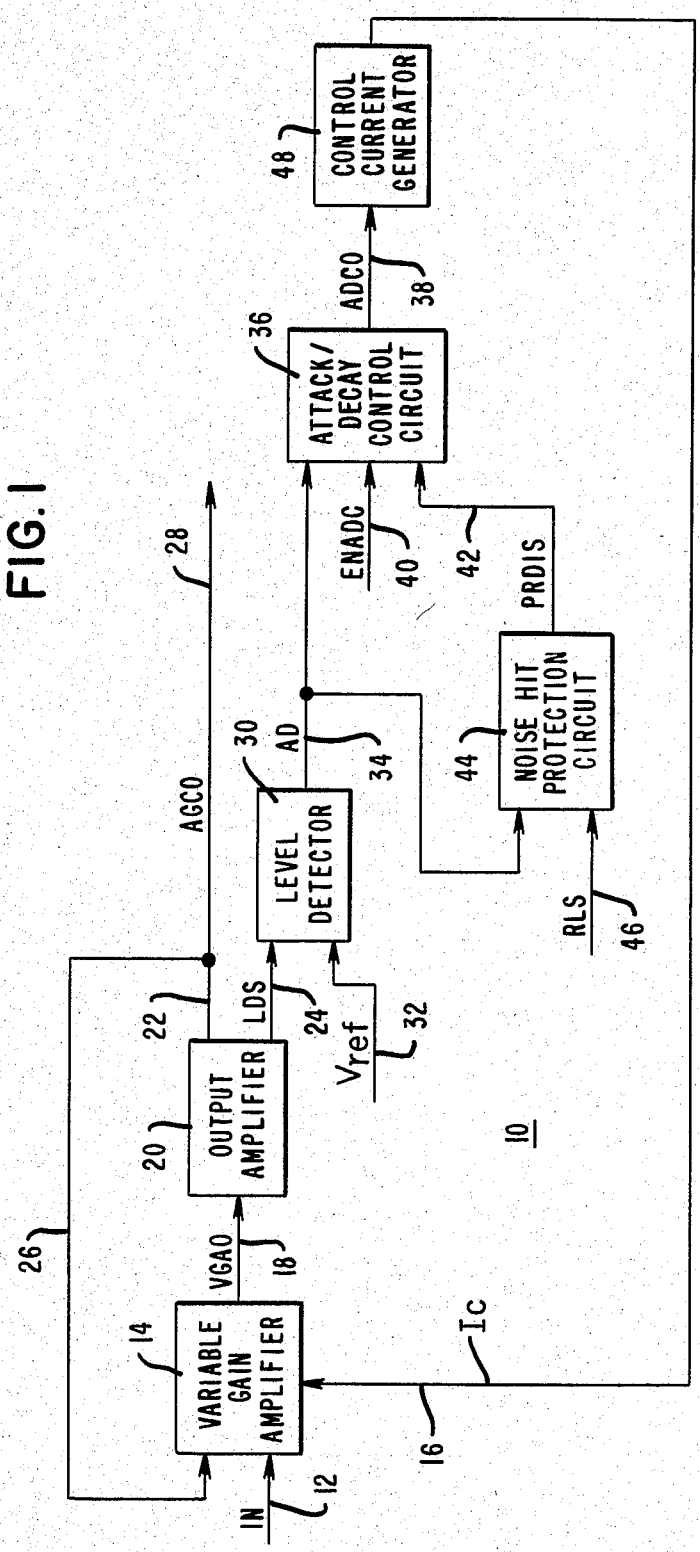
FIG. 1 is a block diagram of an automatic gain control circuit according to the invention.

Referring first to FIG. 1, there is shown an automatic gain control circuit 10 suitable for use in a receiver section of a modem (not shown) which is utilized in a digital data transmission system wherein the data is transmitted in quadrature amplitude modulation (QAM) form. The gain control circuit 10 will first be described generally with reference to the blocks shown in FIG. 1, whereafter a more detailed description of the individual blocks will be presented. The received signal is applied over a line 12 to a variable gain amplifier 14 which amplifies the input signals by a factor determined by a control current $I_c$ on a lead 16.

The gain controlled output signal VGAO of the variable gain amplifier 14 is applied over a line 18 to an output amplifier 20 which provides an output signal AGCO on a line 22 which represents the signal VGAO and an output signal LDS on a line 24 which represents a predetermined multiple of the signal VGAO. The signal LDS is a buffered (low impedance) analog signal having in the present embodiment an amplitude 11 times the amplitude of the signal VGAO. The output signal AGCO is fed back over a line 26 to an input of the variable gain amplifier 14 and is applied over a line 28 for processing in the modem receiver (not shown).

The signal LDS on the line 24 is applied to a level detector 30 to which is applied a reference potential $V_{ref}$ over a line 32. In the present embodiment $V_{ref}$ has a value of +5 V. The level detector 30 detects and compares the level of the signal LDS with the reference potential $V_{ref}$. An output signal AD on a line 34 is at a high logic level or a low logic level according as the level of the signal LDS is greater or less than the reference potential $V_{ref}$.

The line 34 is coupled to an attack/decay control circuit 36 which provides, on a line 38, an output signal ADCO containing control information. The attack/decay control circuit 36 receives as inputs: the signal AD on the line 34; a signal ENADC on a line 40 from a microprocessor (not shown) in the modem receiver; and a signal PRDIS on a line 42 provided by a noise hit protection circuit 44. The level of the signal AD determines whether an attack operation (reduction in gain of the variable gain amplifier 14) or a decay operation (increase in gain of the variable gain amplifier 14) is to take place. Thus a high level for the signal AD produces an attack operation whereas a low level for the signal AD produces a decay operation. The ENADC signal has a selected one of two levels. According as the signal ENADC has a high or a low level, the decay speed is slow or high respectively. The signal PRDIS is effective, when an attack operation is taking place, to abort the attack operation and to force a decay operation for a predetermined time. The output signal ADCO is either at ground level or at a −5 V level or is an open circuit.

The noise hit protection circuit 44 monitors the signal AD. If the signal AD is high, signifying an attack operation, for greater than a predetermined time, which is selected as 50 microseconds in the present embodiment, the circuit 44 will cause the output signal PRDIS to be high thereby aborting the attack operation as discussed hereinabove. Operation of the noise hit protection circuit 44 is disabled in response to a signal RLS on a line 46, provided by the aforementioned microprocessor in the modem receiver. Thus if the signal RLS has a low level, the noise hit protection circuit 44 is disabled. If the signal RLS has a high level the noise hit protection circuit 44 is enabled.

Figure 9:
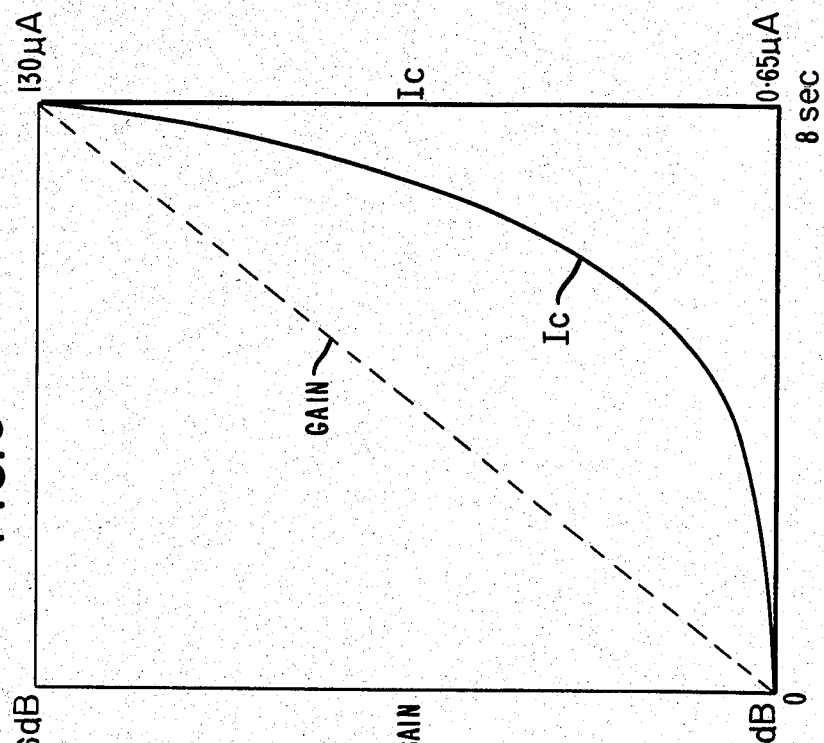
FIG. 9 is a graphical representation of the behavior of two circuit parameters with respect to time during a decay operation in the circuit of FIG. 1.
Figure 8:
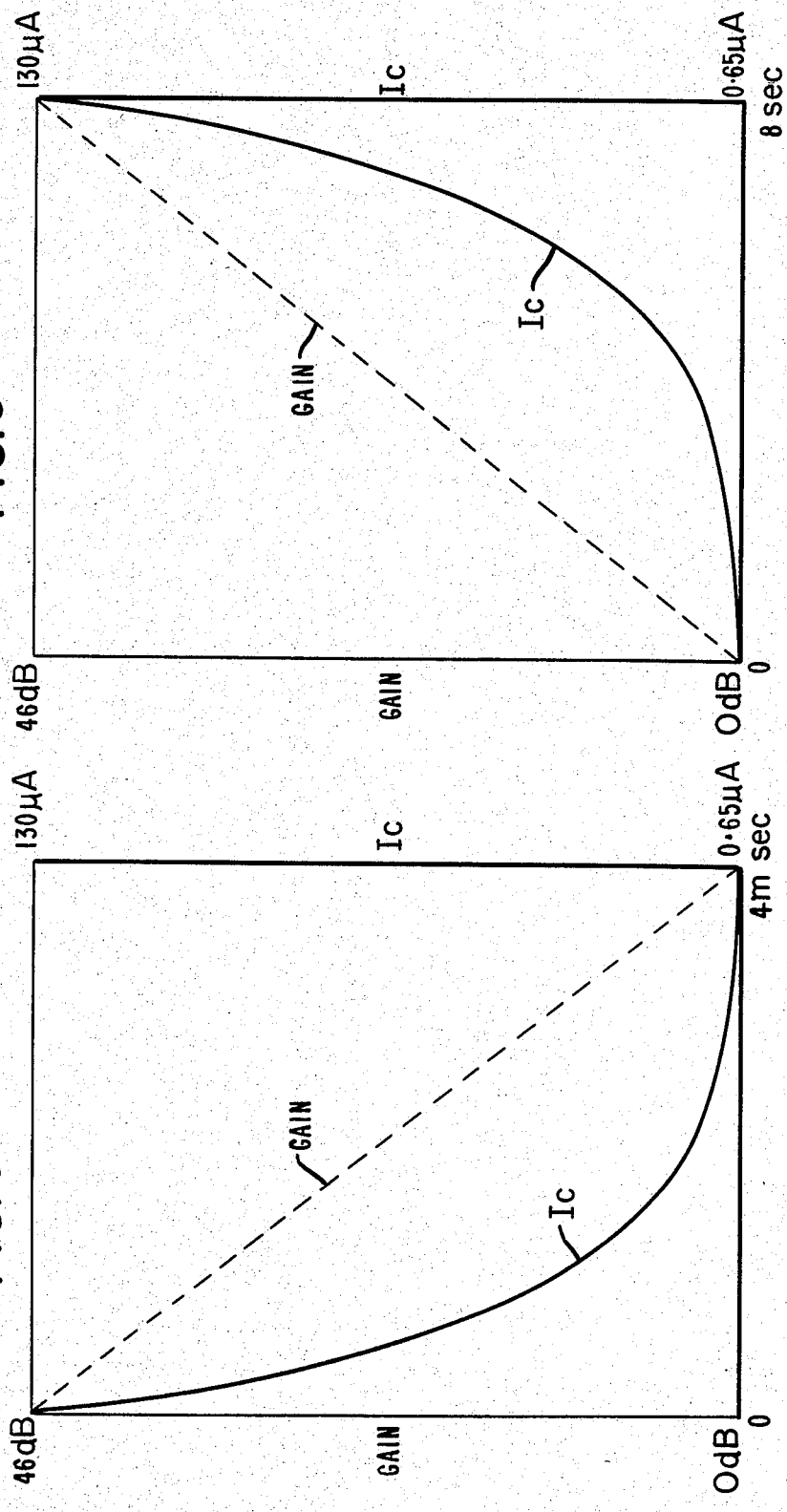
FIG. 8 is a graphical representation of the behavior of two circuit parameters with respect to time during an attack operation in the circuit of FIG. 1.

The lead 38 is coupled to a control current generator 48 which, in dependence on the signal ADCO, provides, on the line 16, the control current $I_c$ for the variable gain amplifier 14. The control current $I_c$ decreases in a negative exponential manner for an attack operation as shown in FIG. 8 and increases in a positive exponential manner as shown in FIG. 9 for a decay operation. It will be appreciated that this exponential variation in the control current $I_c$ provides attack and decay speeds which are independent of the level of the received signal. The gain actually produced in the variable gain amplifier 14 is shown by the dashed lines in FIGS. 8 and 9. If the signal ADCO from the attack/decay control circuit 36 is at ground level, the control current $I_c$ decreases, corresponding to an attack operation. If the signal ADCO is at the −5 V level the control current $I_c$ increases rapidly, corresponding to a fast decay operation. If the signal ADCO is open circuit (i.e. high impedance) the control current $I_c$ increases slowly, corresponding to a slow decay operation.

Figure 2:
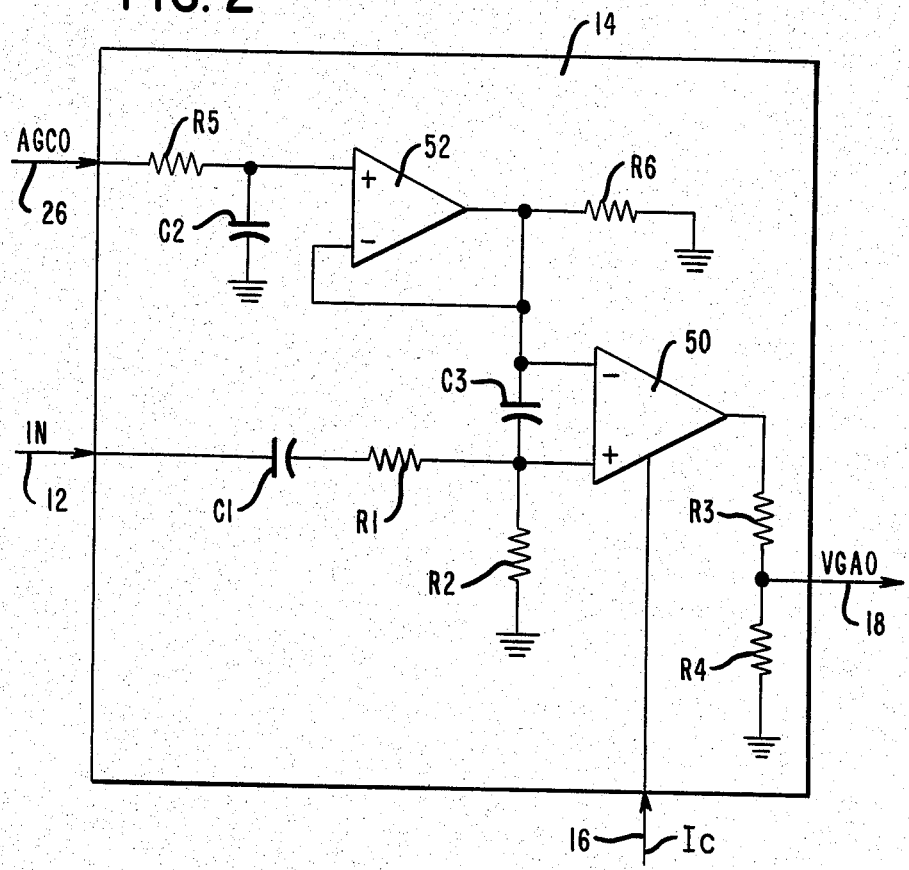
FIG. 2 is a circuit diagram of a variable gain amplifier included in the circuit of FIG. 1.

The variable gain amplifier 14 will now be described in detail with reference to FIG. 2. The input signal on the lead 12 is applied to a 0.68 microfarad ($\mu$F) decoupling capacitor C1 and is attenuated by resistors R1 and R2, the attenuated signal being applied to the non-inverting input of an operational transconductance amplifier 50 which may be an operational transconductance amplifier having the part number CA3080 manufactured by RCA Corporation. The resistors R1 and R2 have the values 3.48 kilohms (Kohm) and 100 ohms respectively. It should be understood that the transconductance of the operational transconductance amplifier 50 is directly proportional to the control current $I_c$. The amplifier 50 has resistors R3, R4 coupled in series to its output. The 1 megohm (Mohm) resistor R4, in conjunction with the control current $I_c$, determines the gain of the amplifier 50. The 220 Kohm resistor R3 limits the peak-to-peak amplitude of the output signal VGAO on the lead 18 to meet the requirements of the output amplifier 20.

Connected to the inverting input of the operational transconductance amplifier 50 is an operational amplifier 52 which has unity gain. The operational amplifier 52 may be a device having the part number TL084A manufactured by Texas Instruments Inc. The signal AGCO on the line 26 from the output amplifier 20 is applied to an RC filter formed by a 1.5 Mohm resistor R5 and a 0.68 $\mu$F capacitor C2, thereby attenuating AC frequency components usually present in the received line signal. The output of the RC filter formed by the resistor R5 and the capacitor C2 is coupled to the non-inverting input of the operational amplifier 52. The output of the operational amplifier 52 is coupled to the inverting input of the operational transconductance amplifier 50. This arrangement is effective to compensate for the d.c. offset voltage in the amplifier 50, the operational amplifier 52 and the output amplifier 20. A 51.1 ohm resistor R6 limits the maximum output voltage of the operational amplifier 52 to protect the input of the operational transconductance amplifier 50 and serves to decrease the input impedance of the amplifier 50 for high-frequency noise signals. A 0.1 $\mu$F capacitor C3 connected across the inverting and non-inverting inputs of the amplifier 50 serves to attenuate high-frequency noise signals.

Figure 3:
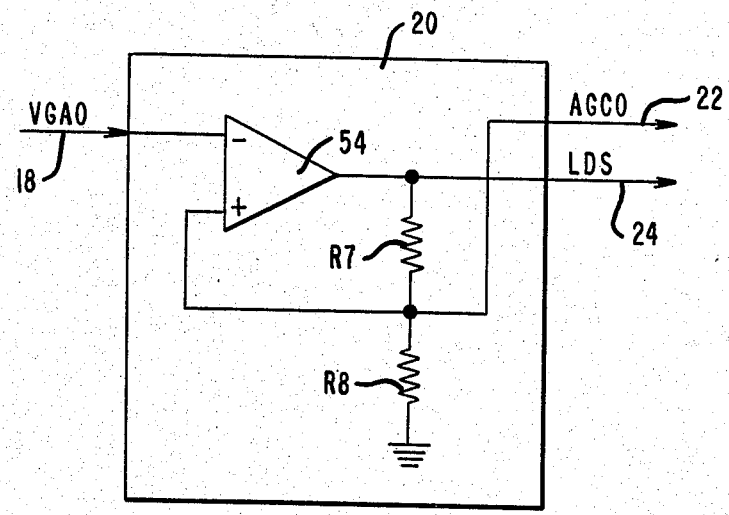
FIG. 3 is a circuit diagram of an output amplifier included in the circuit of FIG. 1.

Turning to FIG. 3, there is shown a detailed circuit diagram of the output amplifier 20. The signal VGAO on the line 18 is applied to the inverting input of an operational amplifier 54, which may be a Texas Instruments TL084A device, and which serves to prevent the AGCO signal from loading. Resistors R7, R8 coupled to the output of the operational amplifier 54 determine the signal LDS as being a multiple of 11 times the signal VGAO. The resistor R7 has a value of 1 Kohm and the resistor R8 has a value of 100 ohms. The signal AGCO, produced on the line 22, is a voltage-follower output of the amplifier 54 and is equal to the signal VGAO multiplied by unity. The output signal AGCO provides the automatic gain control circuit output on the line 28 (FIG. 1) and is also fed back to the variable gain amplifier 14 for d.c. offset compensation as has been described hereinabove.

Figure 4:
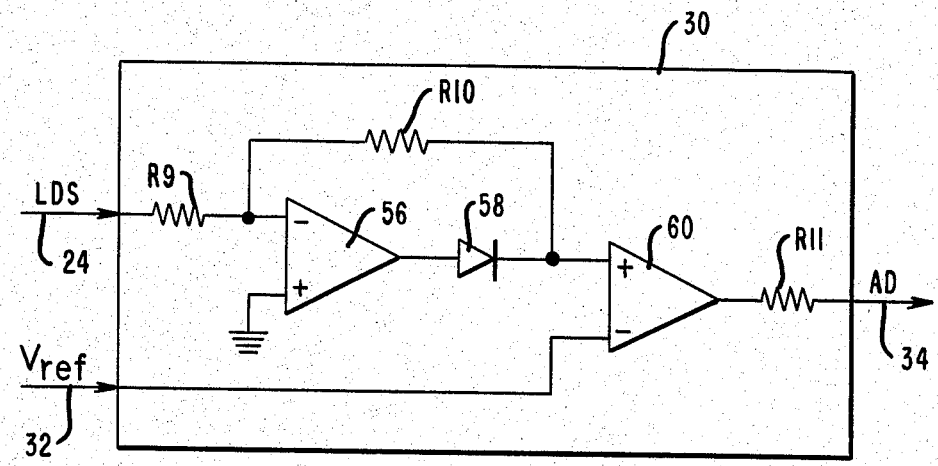
FIG. 4 is a circuit diagram of a level detector included in the circuit of FIG. 1.

Referring to FIG. 4, the level detector 30 shown therein performs full-wave rectification and voltage comparison. The input signal LDS on the line 24 is applied through a 10 Kohm resistor R9 to the inverting input of an operational amplifier 56 which may be a Texas Instruments TL084A device. The output of the operational amplifier 56 is coupled via a diode 58 to the non-inverting input of an operational amplifier 60 which may be a Texas Instruments TL084A device. The inverting input of the amplifier 56 is coupled to the non-inverting input of the amplifier 60 through a 10 Kohm resistor R10. When the signal LDS is negative the amplifier 56 delivers a positive output which is applied to the non-inverting input of the amplifier 60. When the signal LDS is positive the output of the amplifier 56 is blocked by the diode 58. Since the non-inverting input of the amplifier 60 presents a very high impedance to the rectified signal, no current flows through the resistors R9, R10 and hence the level of the signal at the non-inverting input of the amplifier 60 is equal to LDS. The amplifier 60 is utilized as a comparator, its inverting input being coupled to a +5 V reference source, $V_{ref}$ on line 32 such that when the input signal is greater than the reference voltage the output is at a high logic level and is at a low logic level when the input signal is less than the reference voltage. The output of the amplifier 60 is connected to a 10 Kohm resistor R11 to provide a suitable level for the output signal AD on the lead 34.

Figure 5:
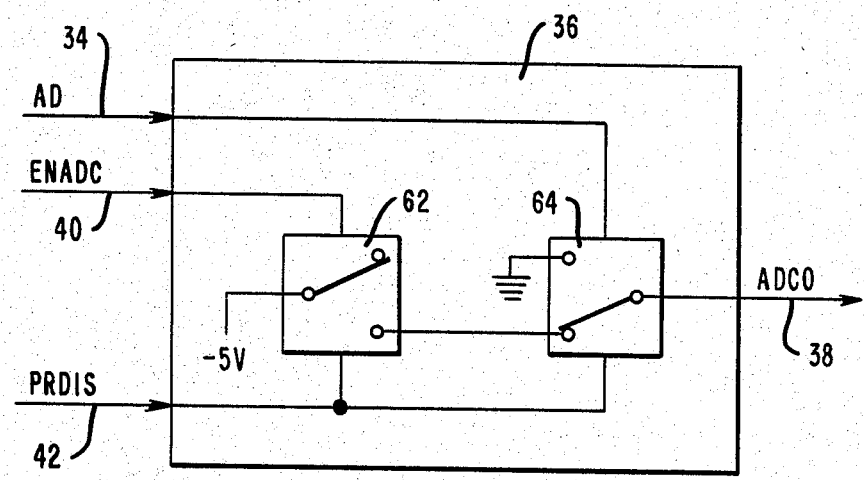
FIG. 5 is a circuit diagram of an attack/decay control circuit included in the circuit of FIG. 1.

Referring to FIG. 5, the attack/decay control circuit 36 is formed by an analog switch device including a pair of analog switches 62, 64, and can be implemented by an analog multiplexer/demultiplexer device having the part number MC14053B manufactured by Motorola Inc. The switches 62, 64 are responsive to the signals AD, ENADC and PRDIS to provide an output signal ADCO on the lead 38 in accordance with the following TABLE which in the final column identifies the nature of the automatic gain control operation performed in accordance with the value of the signal ADCO:

TABLE

| Condition | PRDIS | ENADC | AD | Output ADCO | Function |
| --- | --- | --- | --- | --- | --- |
| 1 | High | X | X | O/C | Slow decay |
| 2 | Low | High | Low | O/C | Slow Decay |
| 3 | Low | X | High | GND | Attack |
| 4 | Low | Low | Low | −5V | Fast decay |

It will be appreciated that the switch 62 is shown for the input logic condition ENADC=1 (high level) and the switch 64 is shown for the input logic condition AD=0 (low level). The signal PRDIS causes both switches to assume an intermediate, open-circuit (floating) state.

Figure 6:
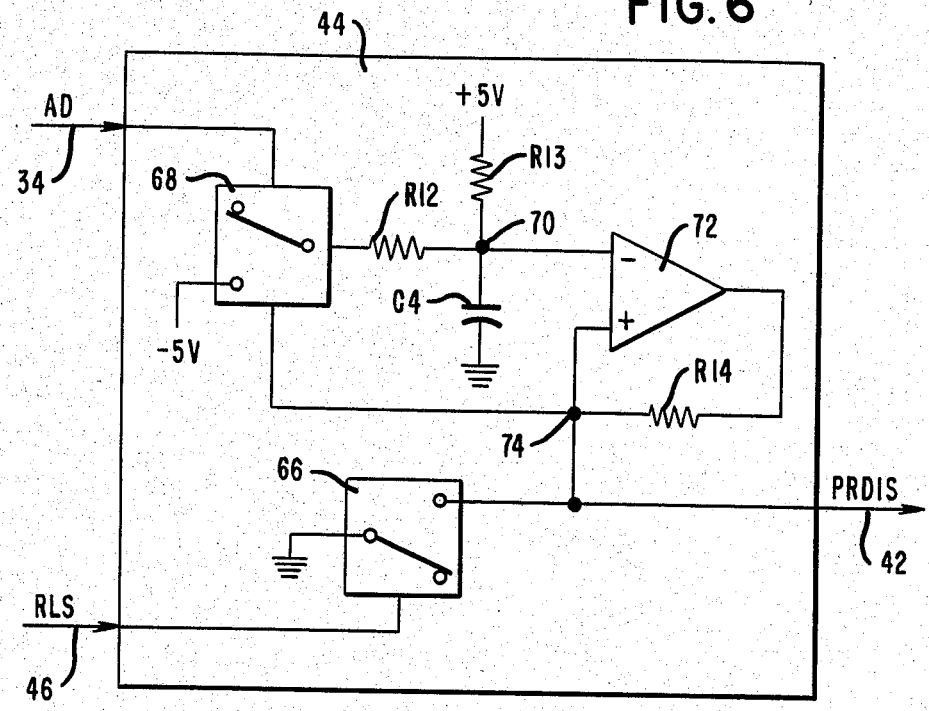
FIG. 6 is a circuit diagram of a noise hit protection circuit included in the circuit of FIG. 1.

Referring to FIG. 6, there is shown a circuit diagram of the noise hit protection circuit 44. The input line 46 is coupled to a control input of a switch 66 arranged to selectively connect the output line 42 to ground. The circuit 44 is disabled by a low logic level signal RLS on the line 46 and is enabled by a high logic level signal RLS, which operates the switch 66 to the position shown in FIG. 6. The input lead 34 is coupled to a control input of a switch 68. The output of the switch 68 is connected over a 511 ohm resistor R12 to a junction point 70 to which is coupled a 0.1 μF capacitor C4. The junction point 70 is coupled through a 42.2 Kohm resistor R13 to a +5 V supply voltage source and to the inverting input of an operational amplifier 72 which may be a Texas Instruments TL084A device. The output of the amplifier 72 is coupled via a 10 Kohm resistor R14 to a junction point 74. The junction point 74 is coupled to the output line 42, to the non-inverting input of the amplifier 72, to a further control input of the switch 68, and to the output of the switch 66.

When the signal AD is high the switch 68 connects a −5 V supply voltage source to the resistor R12 thereby providing a discharge path for the capacitor C4. If the signal AD becomes low the switch 68 is operated to the position shown in FIG. 6. If the signal AD remains high for at least a predetermined time corresponding to a decrease in gain of 0.5 dB, the voltage at the inverting input of the operational amplifier 72 falls below that at its non-inverting input and the signal PRDIS becomes high. This causes the switch 68 to disconnect from the −5 V supply potential and to open-circuit the switch 68 output. Thus the capacitor C4 commences to charge through the resistor R13. After approximately 10 ms the voltage across the capacitor C4 rises to a level which exceeds that of PRDIS and hence the operational amplifier 72 is effective to cause the signal PRDIS to become low again. The low state value of the signal PRDIS is approximately −0.7 V and is determined by the resistor R14 and the input characteristics of the switches 62, 64 (FIG. 5) to which is signal PRDIS applied. The switch 68 can be a Motorola analog multiplexer/demultiplexer switch device having the part number MC14053B.

Figure 7:
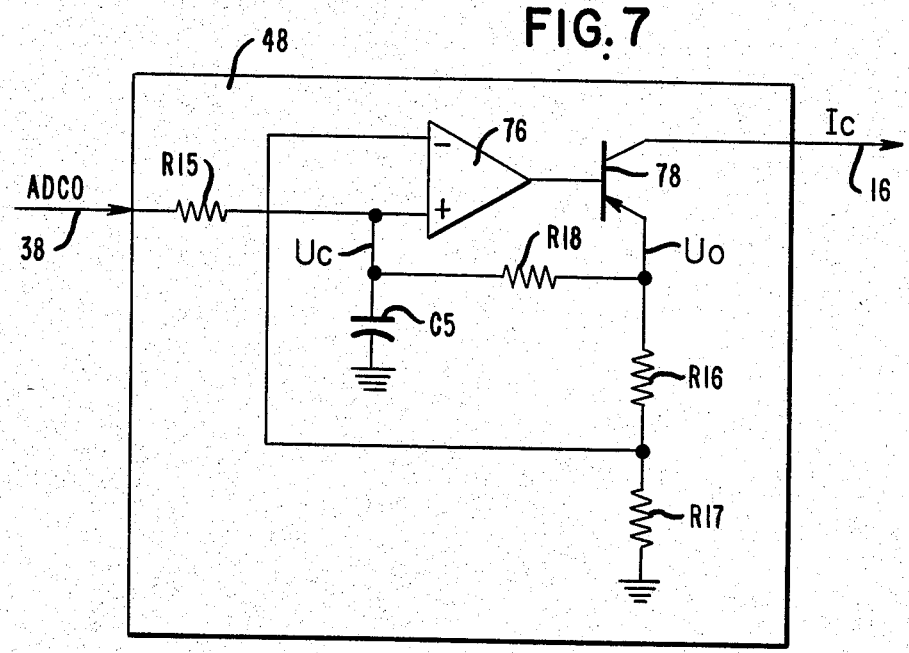
FIG. 7 is a circuit diagram of a control current generator included in the circuit of FIG. 1.

Referring now to FIG. 7 there is shown a circuit diagram for the control current generator 48. The input line 38 is coupled via a 3.48 Kohm resistor R15 to the non-inverting input of an operational amplifier 76 which may be a device having the part number TL084A manufactured by Texas Instruments Inc. The non-inverting input of the amplifier 76 is coupled to a capacitor C5. The output of the amplifier 76 is connected to the base of a PNP transistor 78. The emitter of the transistor 78 is coupled through series-connected resistors R16 and R17, each having a value of 38.3 Kohm, to ground and is also coupled via a 6.8 Mohm resistor R18 to the non-inverting input of the amplifier 76. The collector of the transistor 78 is connected to the output line 16 on which the control current $I_c$ is provided. The circuit parameters are such that the voltage $U_0$ at the emitter of the transistor 78 is twice the voltage $U_c$ across the capacitor C5 at the non-inverting input of the amplifier 76.

The value of the control current $I_c$ is approximately proportional to $U_0$ as can be seen from the following equation:

$$I_c = \frac{U_0}{R16 + R17} - I_b \approx \frac{U_0}{R16 + R17} \quad (1)$$

since $I_b$, the base current in the transistor 78, is sufficiently small to be neglected.

When the signal ADCO is at a logic low level (ground), the capacitor C5 discharges through the resistor R15 in a negative exponential manner. This produces an attack speed in decibels which is independent of $U_c$. The output current $I_c(t)$ is given by the following equation:

$$I_c(t) = -\frac{U_c(t=0)}{R17} \exp(-t/R15 \cdot C5) \quad (2)$$

In this equation $U_c(t=0)$ represents the (negative) voltage across the capacitor C5 at the start of the discharge ($t=0$). $I_c$ decreases exponentially as clearly seen from equation (2) and as is illustrated in FIG. 8 wherein the solid line represents a plot of the control current $I_c$ against time and the dashed line represents the corresponding gain.

When the input signal ADCO is open-circuit (floating) corresponding to a slow decay operation, the capacitor C5 charges through the resistor R18. It will be appreciated that with the configuration shown in FIG. 7 a higher voltage across the capacitor C5 results in a higher charge current and that an exponentially increasing control current $I_c$ is provided, as is illustrated in FIG. 9 wherein the solid line represents a plot of the control current $I_c$ against time. This behavior is evident from the following equation (3):

$$I_c(t) = -\frac{U_c(t=0)}{R17} \exp(t \cdot R16/R18 \cdot R17 \cdot C5) \quad (3)$$

It will be appreciated that since $I_c$ increases exponentially a decay speed in decibels is provided which is independent of $U_c$.

When the input signal ADCO is at a $-5$ V level the capacitor C5 charges through the resistor R15 and a fast decay operation is produced. Under these conditions $I_c$ increases in accordance with the following equation (4):

$$I_c(t) = -\frac{U_c(t=0) + 5}{R17} \exp(-t/R15 \cdot C5) + \frac{5}{R17} \quad (4)$$

The operation of the automatic gain control circuit 10 will now be described in more detail with particular reference to FIGS. 10–15, which illustrate the input and output signals for the automatic gain control circuit 10 under various input conditions, and the behavior of the control current $I_c$. In FIGS. 10–15 it should be understood that the time plots illustrated for the input and output signals represent signal levels in decibels rather than the actual analog waveforms.

For ease of explanation, there will first be described the data phase behavior of the automatic gain control circuit 10, that is to say, the condition when data signals are being received on the input lead 12. In the data phase the signal ENADC is high, producing a slow decay operation; the signal RLS is also high thereby enabling the noise hit protection circuit 44, and the signal PRDIS is low. The input signal is amplified by an amount to provide an output signal AGCO whose level is close to that required. When at a given instant the output signal AGCO is too high the automatic gain control circuit 10 performs an attack operation in response to the level detector 30 providing a high level signal AD. When the signal AD is high the attack-/decay control circuit 36 provides a ground level output signal as described above to cause the control current $I_c$ provided by the control current generator 48 to decrease in an exponential manner. This decrease causes a reduction in gain in the variable gain amplifier 14 and a reduction in the level of the output signal AGCO from the output amplifier 20. When the signal AGCO becomes lower than the reference potential $V_{ref}$, the signal AD changes to a low level and the output signal of the attack/decay control circuit 36 becomes an open-circuit (floating). As described above this causes the control current generator 48 to cause to control current $I_c$ to increase exponentially until the level of the signal AGCO again exceeds the voltage reference level $V_{ref}$, the signal AD becomes high again causing a repetition of the above-described operation.

Figure 10:
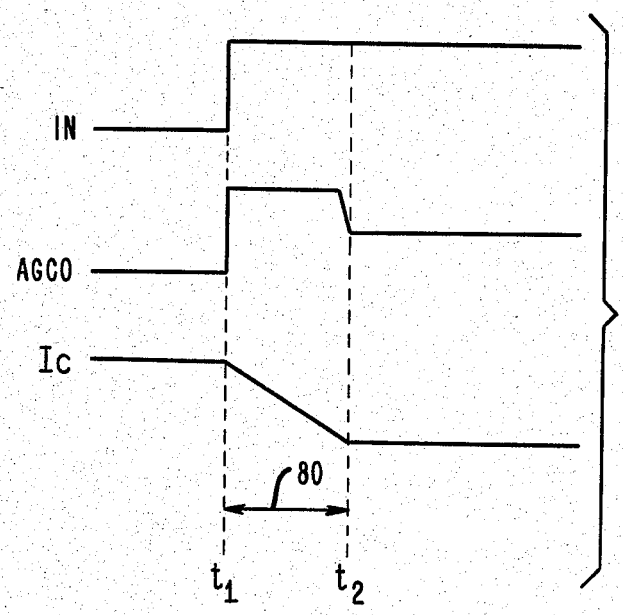
FIG. 10 is a time plot illustrating the no-signal to signal behavior of the circuit of FIG. 1.

Referring now to FIG. 10, there is illustrated the behavior of the automatic gain control circuit 10 in response to a transition on the input lead 12 from a state when no signal is received to a state wherein a signal is received. The top plot in FIG. 10 represents (as a signal level) the signal IN on the input lead 12. When no signal is present, the amplification of the variable gain amplifier 14 is at a maximum, as determined by the control current $I_c$ which is also at a maximum. However, since no signal is present the output signal AGCO is at a zero level.

At time $t_1$ it is assumed that a signal is received on the input lead 12. Since the control current $I_c$ is at a maximum value the output signal AGCO rises to a maximum level. This causes a high level signal AD and introduces an attack operation during the time period $t_1$ to $t_2$ as shown by reference 80. At time $t_2$ it is assumed that the control current has fallen to a nominal level in accordance with the input signal level, the output signal AGCO of the automatic gain control circuit 10 also becoming a nominal level.

It should be understood that prior to the reception of a data input signal on the lead 12 the microprocessor controlled signal RLS is at a low level thereby disabling operation of the noise hit protection circuit 44. Following the just-described attack operation the signal RLS will be set to high thereby enabling the noise hit protection circuit 44.

Figure 11:
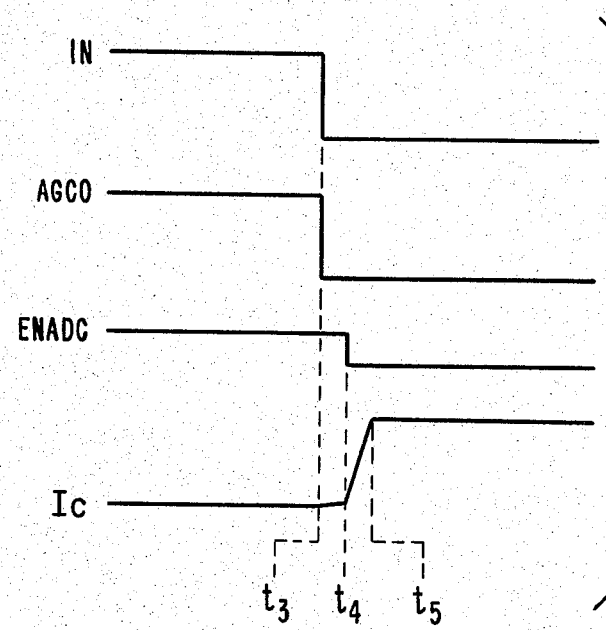
FIG. 11 is a time plot illustrating the signal to no-signal behavior of the circuit of FIG. 1.

The behavior of the automatic gain control circuit 10 in response to the termination of a data input signal at the end of a data phase operation will now be described with reference to FIG. 11. At time $t_3$ the input signal IN terminates and substantially simultaneously the output signal AGCO falls rapidly to zero. The output signal AD of the level detector 30 therefore goes low and the attack/decay control circuit 36 causes the control current generator 48 to become an open-circuit thereby causing a slow decay operation since the control current $I_c$ increases relatively slowly. At time $t_4$ the receiver detects that line input signals are no longer present and microprocessor control causes the signal ENADC to change from high to low thereby causing the attack/decay control circuit output ADCO to become a $-5$ V level which initiates a fast decay operation wherein the control signal $I_c$ is caused to increase more rapidly until the time $t_5$.

Figure 12:
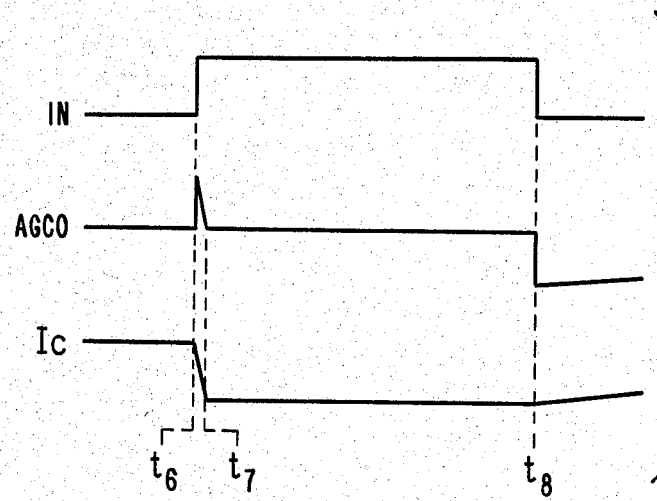
FIG. 12 is a time plot illustrating the gain hit behavior of the circuit of FIG. 1 with the noise hit protection circuit inactive.
Figure 13:
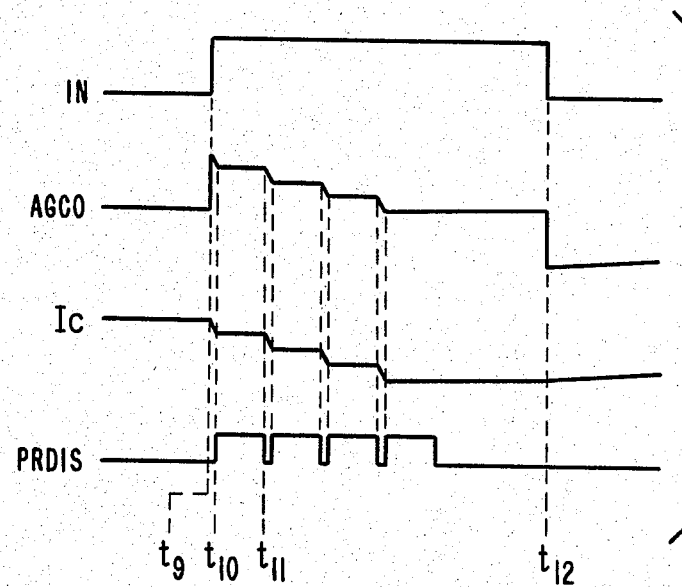
FIG. 13 is a time plot illustrating the gain hit behavior of the circuit of FIG. 1 with the noise hit protection circuit active.
Figure 14:
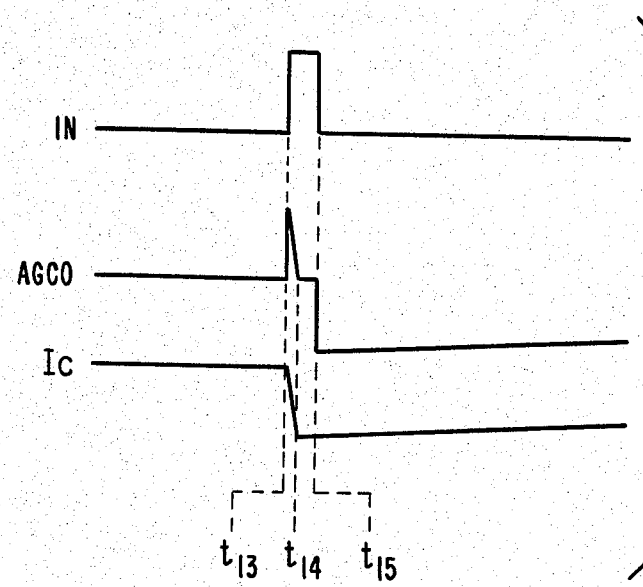
FIG. 14 is a time plot illustrating the noise hit behavior of the circuit of FIG. 1 with the noise hit protection circuit inactive.

Operation in response to a sudden change in signal level, referred to as a gain hit, during the data phase will now be described. Referring to FIG. 12, operation when the noise hit protection circuit 44 is disabled by a low level signal RLS will first be described. At time $t_6$ it is assumed that a gain hit of 2 dB occurs. As is seen in FIG. 12 the input level increase is followed initially by an increase in the output signal AGCO. However, this increase causes the level detector 30 to provide a high level signal AD thereby causing to attack/decay control circuit 36 to initiate an attack operation by providing a ground level ADCO signal to the control current generator 48. This causes an attack operation in which the control current $I_c$ decreases rapidly until time $t_7$ when the signal LDS on the line 24 becomes equal to the reference voltage $V_{ref}$. At the time $t_7$ the signal AGCO will have reverted to its nominal level. When the gain hit terminates at time $t_8$ a slow decay operation takes place as is seen from the slowly rising level of the control current $I_c$ after time $t_8$.

There will now be considered the effect of a gain hit when the signal RLS is high, whereby the noise hit protection circuit 44 is enabled. At time $t_9$ an attack operation is initiated as has just been described. However, after approximately 50 μs (50 microseconds) at time $t_{10}$ the noise hit protection circuit 44 causes signal PRDIS to go high thereby inhibiting the attack operation. The signal PRDIS remains high for about 10 msec (10 milliseconds) until time $t_{11}$ after which a further attack operation is enabled for a further period of 50 μs. It will be appreciated that the output level AGCO reverts to its nominal level in steps which in the present embodiment are steps of 0.5 dB. The total attack time is about 40 ms as opposed to 200 μs in the situation described above when the noise protection circuit 44 is disabled. It is found in practice that this lengthened decay operation does not adversely affect the performance of the modem receiver in which the automatic gain control circuit 10 is utilized. When the gain hit terminates at time $t_{12}$ a slow decay operation takes place as before.

The behavior of the automatic gain control circuit 10 in the data phase when a noise hit occurs will now be considered. A noise hit may be considered as a high amplitude noise pulse having a relatively short duration, e.g. a few milliseconds. To clarify the effect of the operation of the noise hit protection circuit 44 the behavior of the automatic gain control circuit 10 will first be considered where no noise hit protection circuit 44 is provided. Assume that noise hit of, say 6 dB above the input data signal level occurs for about 5 ms from time $t_{13}$. The noise pulse is illustrated on the input signal IN at the top of FIG. 14. The response of the circuit is similar to that described with reference to FIG. 12. Thus, an attack operation takes place rapidly, at about 10 dB/msec during the time interval $t_{13}$ to $t_{14}$. At time $t_{15}$ when the noise impulse terminates, the output signal AGCO drops to about 6 dB below its nominal level and a slow decay operation then takes place. During this decay, and particularly initially after time $t_{15}$, the output signal AGCO will be at a low level and it is found that such low level may cause errors in a modem receiver in which the signal AGCO is utilized in that the modem will loose synchronization.

Figure 15:
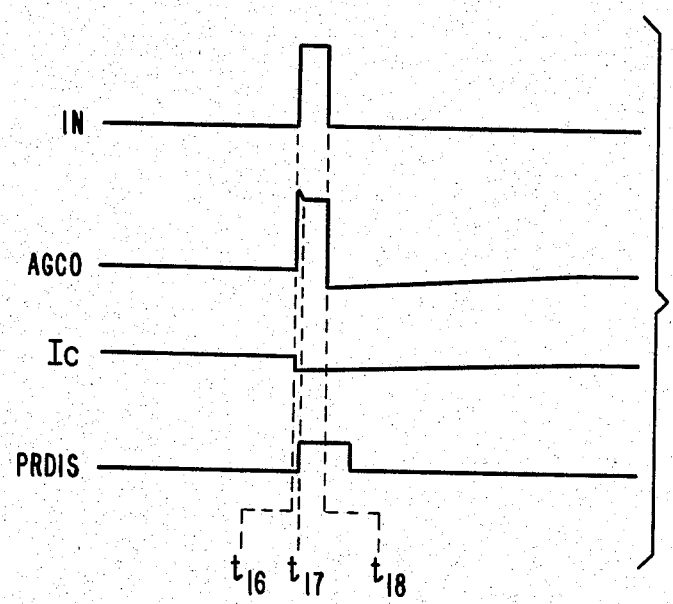
FIG. 15 is a time plot illustrating the noise hit behavior of the circuit of FIG. 1 with the noise hit protection circuit active.

Referring now to FIG. 15, operation in the data phase in response to a noise hit which occurs when the noise hit protection circuit 44 is enabled by a high level signal RLS will now be described. Assuming the same noise hit amplitude of 6 dB and duration of 5 msec, initially at time $t_{16}$, the signal AGCO will rise by 6 dB causing an attack operation, in the manner previously described. However, after about 50 μs, at time $t_{17}$, when the signal AGCO has decreased by about 0.5 dB, the signal PRDIS will become high, as was described hereinabove with reference to FIG. 6. The high level signal PRDIS will last for about 10 msec, inhibiting any further attack operation for such period. In fact, as was described above, a slow decay operation will take place but because of the slow nature of such decay operation, the AGCO level may be regarded as approximately constant for a few milliseconds. During the occurrence of the high level PRDIS signal, it is assumed that at time $t_{18}$ the noise hit signal terminates. Initially, the signal AGCO will follow the input level drop of about 6 dB resulting in an AGCO level of about 0.5 dB below its nominal level. Such relatively small reduction in the AGCO level below its nominal level is found not to adversely affect synchronization in a modem receiver utilizing the signal AGCO. Thus synchronization will be maintained even though erroneous data may be detected as a result of the hit.

Thus it will be appreciated that the noise hit protection circuit 44 ensures that the AGCO level output drops by only about 0.5 dB as compared with a drop of about 6 dB without the noise hit protection circuit. It should be noted that a larger amplitude noise pulse will cause an even greater drop in the level of the signal AGCO where the noise protection circuit 44 is not provided. However with the noise protection circuit 44 effective the signal level drop will still be only about 0.5 dB. Normally, a noise pulse is of shorter duration than 10 msec. However, if a noise pulse should last for longer than 10 msec then the signal AGCO will be caused to adjust its output level by 0.5 dB for every 10 ms that the noise impulse lasts. However a considerable advantage is nevertheless achieved than if no noise hit protection circuit 44 were provided.

I claim:

1. An automatic gain control circuit comprising:
   means for amplifying an input signal to develop a first signal;
   means for generating a second signal to control the gain of said amplifying means;
   means responsive to said first signal and to a predetermined reference voltage level for providing to said generating means a first logic signal when said first signal is greater in amplitude than said predetermined reference voltage level and a second logic signal when said first signal is lower in amplitude than said predetermined reference voltage level, said generating means being responsive to said first logic signal for causing said second signal to vary in a first direction to reduce the gain of said amplifying means and being responsive to said second logic signal for causing said second signal to vary in a second direction to increase the gain of said amplifying means; and
   means, responsive to said first logic signal when its duration is longer than a first predetermined time period, for causing said generating means to prevent said second signal from varying in the first direction for a second predetermined time period, thereby inhibiting any reduction in gain of said amplifying means during the second predetermined time period.

2. The automatic gain control circuit of claim 1 wherein:

said amplifying means includes an operational transconductance amplifier; and said generating means includes a control current generator adapted to provide said second signal in the form of a control current varying in the first and second directions in an exponential manner.

3. The automatic gain control circuit of claim 2 wherein:

said generating means is responsive to said first logic signal for causing the gain of said amplifying means to be reduced at a relatively high rate and to said second logic signal for causing the gain of said amplifying means to be increased at a relatively low rate.

4. The automatic gain control circuit of claim 3 wherein:

said causing means develops a protection signal whenever said first logic signal is provided for longer than the first predetermined time period in order to cause said control current generator to provide said second signal varying in the second direction for the second predetermined time period.

5. The automatic gain control circuit of claim 1 wherein:

said causing means is selectively operable under the control of a protection enabling signal.

6. The automatic gain control circuit of claim 3 wherein:

said generating means is selectively operable in response to a speed control signal to cause the increase in gain in said amplifying means to change from the relatively low rate to a higher rate.

7. The automatic gain control circuit of claim 6 wherein:

said operational transconductance amplifier is responsive to said input signal for developing a third signal; and said amplifying means includes an output amplifier having an input coupled to an output of said operational transconductance amplifier and adapted to provide said first signal and an output signal representing respective first and second predetermined multiples of said third signal provided by said operational transconductance amplifier, said first signal being applied to said providing means and said output signal forming the output of said automatic gain control circuit.

8. The automatic gain control circuit of claim 7 wherein said output signal is fed back to provide d.c. offset compensation for said operational transconductance amplifier.

9. The automatic gain control circuit of claim 4 wherein:

said causing means includes a capacitor having a discharge path including switching means having control inputs operable respectively by said first logic signal and by said protection signal.

10. The automatic gain control circuit of claim 9 wherein:

said generating means includes control switching means coupled to a control input on said control current generator, said control current generator including an operational amplifier having an input coupled to said control input and to a second capacitor and having an output coupled to the base of a transistor having its emitter-collector path coupled to said second capacitor and adapted to provide the control current.

* * * * *